(12) United States Patent
Chen

(10) Patent No.: US 10,522,477 B2
(45) Date of Patent: Dec. 31, 2019

(54) METHOD OF MAKING PACKAGE ASSEMBLY INCLUDING STRESS RELIEF STRUCTURES

(71) Applicant: TAIWAN SEMICONDUCTOR MANUFACTURING COMPANY, LTD., Hsinchu (TW)

(72) Inventor: Hsien-Wei Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/810,602

(22) Filed: Nov. 13, 2017

(65) Prior Publication Data

US 2018/0068960 A1    Mar. 8, 2018

Related U.S. Application Data

(60) Continuation of application No. 15/062,570, filed on Mar. 7, 2016, now Pat. No. 9,818,700, which is a
(Continued)

(51) Int. Cl.
*H01L 23/00* (2006.01)
*H01L 23/16* (2006.01)
(Continued)

(52) U.S. Cl.
CPC ............ *H01L 23/562* (2013.01); *H01L 23/16* (2013.01); *H01L 25/0655* (2013.01);
(Continued)

(58) Field of Classification Search
CPC ....... H01L 23/00; H01L 23/16; H01L 25/065; H01L 23/538; H01L 23/562; H01L 25/0655; H01L 2224/16235; H01L 23/5384; H01L 2224/73204; H01L 2924/3511; H01L 2224/32225
(Continued)

(56) References Cited

U.S. PATENT DOCUMENTS 5,640,045 A * 6/1997 Krausse, III ........ H01L 23/4006
257/633
5,804,883 A   9/1998 Kim et al.
(Continued)

FOREIGN PATENT DOCUMENTS

CN    101640190    2/2010
JP    2000-311905    11/2000

*Primary Examiner* — Alexander O Williams
(74) *Attorney, Agent, or Firm* — Hauptman Ham, LLP

(57) ABSTRACT

A method of making a semiconductor package structure includes bonding a plurality of dies to a substrate, wherein a first die of the plurality of dies is larger than a second die of the plurality of dies. The method further includes adhering a first stress relief structure to the substrate at a corner of the substrate, wherein a distance between the first stress relief structure to a closest die of the plurality of dies to the first stress relief structure is a first distance. The method further includes adhering a second stress relief structure to the substrate along a single edge of the substrate, wherein a distance between the second stress relief structure to a closest die of the plurality of dies to the second stress relief structure is the first distance.

20 Claims, 4 Drawing Sheets

Related U.S. Application Data division of application No. 13/673,703, filed on Nov. 9, 2012, now Pat. No. 9,312,193.

(51) Int. Cl.
*H01L 25/065* (2006.01)
*H01L 23/538* (2006.01)

(52) U.S. Cl.
CPC .............. *H01L 23/5384* (2013.01); *H01L 2224/16225* (2013.01); *H01L 2224/32225* (2013.01); *H01L 2224/73204* (2013.01); *H01L 2924/3511* (2013.01)

(58) Field of Classification Search
USPC .................. 257/723, 685, 778, 777, 686
See application file for complete search history.

(56) References Cited

U.S. PATENT DOCUMENTS

| | | | |
|---|---|---|---|
| 5,892,289 A | 4/1999 | Tokuno | |
| 6,048,656 A | 4/2000 | Akram et al. | |
| 6,281,592 B1 | 8/2001 | Murayama | |
| 6,288,335 B1 | 9/2001 | Lee | |
| 6,313,521 B1 | 11/2001 | Baba | |
| 6,617,682 B1 | 9/2003 | Ma et al. | |
| 6,709,894 B2 | 3/2004 | Tsai et al. | |
| 6,853,089 B2 | 2/2005 | Ujiie et al. | |
| 7,132,746 B2 | 11/2006 | Brandenburg et al. | |
| 7,791,206 B2 | 9/2010 | Takeuchi et al. | |
| 8,373,254 B2 * | 2/2013 | Chen ............... | H01L 23/585 |
| | | | 257/620 |
| 8,389,335 B2 | 3/2013 | Goh et al. | |
| 8,431,437 B2 | 4/2013 | Chen et al. | |
| 8,497,583 B2 | 7/2013 | Chumakov et al. | |
| 8,659,154 B2 | 2/2014 | Meyer et al. | |
| 8,659,167 B1 | 2/2014 | Bowles et al. | |
| 2002/0084532 A1 | 7/2002 | Neogi et al. | |
| 2002/0121705 A1 | 9/2002 | Pu et al. | |
| 2002/0135063 A1 | 9/2002 | Alcoe et al. | |
| 2003/0090872 A1 | 5/2003 | Chu et al. | |
| 2004/0178495 A1 | 9/2004 | Yean et al. | |
| 2005/0093178 A1 | 5/2005 | Huang et al. | |
| 2006/0125059 A1 | 6/2006 | Chen et al. | |
| 2006/0163749 A1 | 7/2006 | Lee et al. | |
| 2007/0035021 A1 | 2/2007 | Suzuki et al. | |
| 2007/0096336 A1 | 5/2007 | Lee et al. | |
| 2007/0178627 A1 | 8/2007 | Jiang et al. | |
| 2008/0012084 A1 | 1/2008 | Kwon et al. | |
| 2008/0017983 A1 | 1/2008 | Tzeng et al. | |
| 2008/0036060 A1 | 2/2008 | Damberg | |
| 2008/0054439 A1 | 3/2008 | Malhan et al. | |
| 2008/0099910 A1 | 5/2008 | Mclellan et al. | |
| 2008/0105009 A1 | 5/2008 | Taniguchi et al. | |
| 2008/0179738 A1 | 7/2008 | Nishimura et al. | |
| 2008/0290505 A1 * | 11/2008 | Kolan ............... | H01L 23/24 |
| | | | 257/713 |
| 2009/0001538 A1 | 1/2009 | Takizawa | |
| 2009/0039524 A1 | 2/2009 | Odegard et al. | |
| 2009/0108429 A1 | 4/2009 | Tsao et al. | |
| 2009/0250258 A1 | 10/2009 | Warigaya et al. | |
| 2009/0267217 A1 | 10/2009 | Kuwabara | |
| 2009/0294931 A1 | 12/2009 | Sham et al. | |
| 2010/0044856 A1 | 2/2010 | Sri-Jayantha et al. | |
| 2010/0078791 A1 | 4/2010 | Yim et al. | |
| 2010/0097775 A1 | 4/2010 | Kashiwazaki et al. | |
| 2010/0264950 A1 | 10/2010 | Kaku et al. | |
| 2010/0283128 A1 | 11/2010 | Chen | |
| 2010/0327421 A1 | 12/2010 | Luan | |
| 2011/0147912 A1 | 6/2011 | Karpur et al. | |
| 2011/0215444 A1 | 9/2011 | Park et al. | |
| 2011/0291299 A1 | 12/2011 | Chumakov et al. | |
| 2012/0112236 A1 * | 5/2012 | Higuma ............... | H01L 33/641 |
| | | | 257/98 |
| 2012/0168967 A1 | 7/2012 | Huang et al. | |
| 2012/0299159 A1 | 11/2012 | Chen | |
| 2013/0049025 A1 | 2/2013 | Chang et al. | |
| 2013/0075937 A1 | 3/2013 | Wang et al. | |
| 2013/0147018 A1 | 6/2013 | Chen et al. | |
| 2013/0170164 A1 | 7/2013 | Luan et al. | |
| 2013/0328179 A1 | 12/2013 | Kim et al. | |
| 2014/0048906 A1 | 2/2014 | Shim et al. | |
| 2014/0077389 A1 | 3/2014 | Shim et al. | |
| 2014/0131877 A1 | 5/2014 | Chen | |
| 2014/0167243 A1 | 6/2014 | Shen | |
| 2015/0179587 A1 | 6/2015 | Shim et al. | |

\* cited by examiner

METHOD OF MAKING PACKAGE ASSEMBLY INCLUDING STRESS RELIEF STRUCTURES

PRIORITY CLAIM

The present application is a continuation of U.S. application Ser. No. 15/062,570, filed Mar. 7, 2016, which is a divisional of U.S. application Ser. No. 13/673,703, filed Nov. 9, 2012, now U.S. Pat. No. 9,312,193, issued Apr. 12, 2016, which are incorporated herein by reference in their entireties.

FIELD

The disclosure relates generally to the field of packaging structures, and more particularly, to stress relief structures for reducing warpage in package assemblies.

BACKGROUND

Modern integrated circuits are formed on semiconductor chips. To increase manufacturing throughput and to lower manufacturing costs, the integrated circuits are manufactured in semiconductor wafers, each containing many identical semiconductor chips. After the integrated circuits are manufactured, semiconductor chips are sawed from the wafers and packaged before they can be used.

In typical packaging processes, semiconductor chips or dies are first attached to package substrates. This includes physically securing the semiconductor chips on the package substrates, and connecting bond pads on the semiconductor chips to bond pads on the package substrates. Underfill, which typically comprises epoxy, is used to further secure the bonding. The semiconductor chips may be bonded using either flip-chip bonding or wire bonding.

After the semiconductor chips are bonded onto the package substrates, the solder regions that join the semiconductor chips with the package substrates often suffer from cracking. This is caused by the stress resulting from the difference in coefficients of thermal expansion (CTE) between the package substrates and the semiconductor chips. The difference in CTEs of different layers of the package substrates and the semiconductor chips also results in stresses. The increase in the size of the package substrates and the semiconductor chips results in stress increase. As a result of the increased stresses, the solder cracking becomes more severe and delamination may occur between different layers of the semiconductor chips. Particularly, the delamination is likely to occur between low-k dielectric layers in the semiconductor chips.

BRIEF DESCRIPTION OF DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having an ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Figure 1:
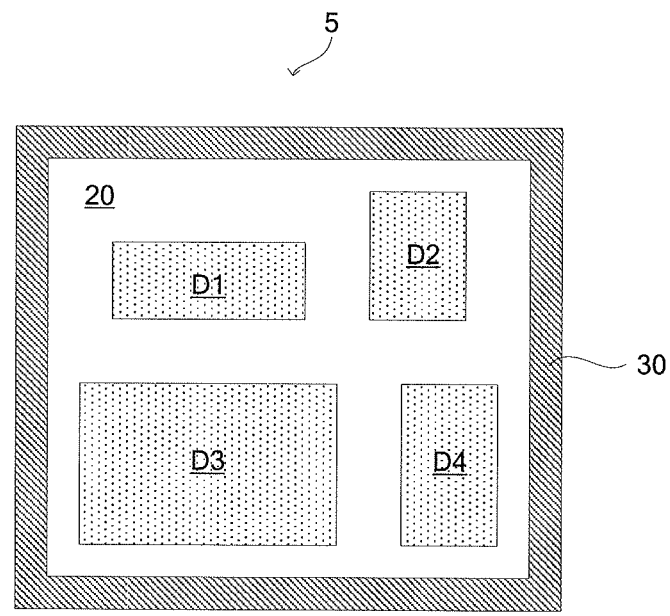
FIG. 1 is a top view of a semiconductor package structure with a stiffener ring surrounding a plurality of dies.

Shown in FIG. 1 is a top view of a semiconductor package structure 10 with a stiffener ring 30 extending about a perimeter of substrate 20 and surrounding a plurality of dies D1, D2, D3, and D4 on the substrate 20 The stiffener ring 30 seals the dies D1, D2, D3, and D4 from moisture and provides a level of mechanical strength to the semiconductor package structure 10. Stiffener ring 30 provides for global warpage control of the semiconductor package structure 10 but may not be sufficient to control local warpages in or around the areas of individual dies D1, D2, D3, and D4. Furthermore, where there is a large die D3 compared to the other dies D1, D2, and D4, the warpage around die D3 may not be adequately controlled by one stiffener ring 30.

Figure 2:
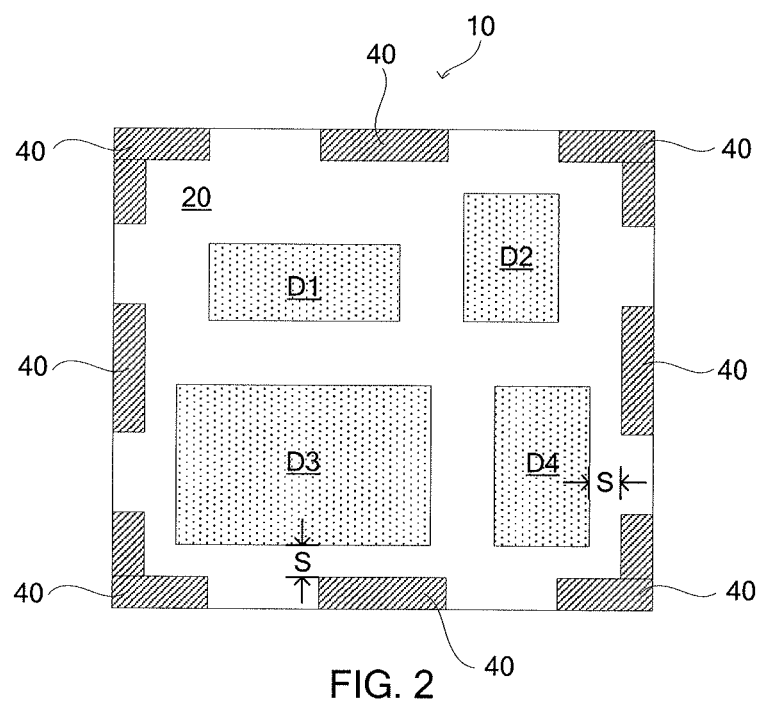
FIG. 2 is a top view of a semiconductor package structure illustrating a layout of stress relief structures on a substrate, according to one embodiment of the present disclosure.

FIG. 2 is a top view of a semiconductor package structure illustrating a layout of stress relief structures on a substrate, according to one embodiment of the present disclosure. Semiconductor package structure 10 includes the plurality of dies D1, D2, D3, and D4 disposed on the substrate 20 and a plurality of stress relief structures 40 disposed around the dies D1, D2, D3, and D4. Stress relief structures 40 provide local stress relief and/or warpage control to semiconductor package structure 10 that may be caused by stress resulting from the difference in coefficients of thermal expansion (CTE) between the substrate 20 and dies D1, D2, D3, and/or D4. Further, stress relief structures 40 may improve the stress redistribution in semiconductor package structure 10 so that local stresses may be redistributed to other regions of the semiconductor package structure. According to one embodiment, stress relief structure 40 is disposed at at least one corner of substrate 20 with at least one of the dies D1, D2, D3 or D4 being adjacent to the stress relief structure 40. The stress relief structure 40 provides for stress relief at that particular corner. According to another embodiment, a stress relief structure 40 is disposed at the four corners of substrate 20, with at least one of the dies D1, D2, D3, or D4 being adjacent to a stress relief structure 40. The spacing S between a die and a stress relief structure 40 may be greater than about 2 µm, or even greater than about 3 µm, to prevent stress relief structure 40 from being shorted to dies D1, D2, D3, or D4. It is realized, however, that the dimensions recited throughout the description are merely examples, and may be changed to other suitable values.

According to one or more embodiments, stress relief structures 40 may be formed using photolithography, patterning, and etching techniques. Stress relief structures 40 may be disposed on substrate 20 by means of an adhesive material (not shown) and may comprise any material suitable for attaching stress relief structure 40 onto substrate 20, such as epoxies, urethane, polyurethane, silicone elastomers, and the like. According to one embodiment, the bonding of stress relief structures 40 onto substrate 20 includes coating an adhesive material on a surface of substrate 20. According to one or more embodiments, a curing process may then be performed to cure the adhesive material. The adhesive material may also have a good thermal conductivity, for example, greater than about 10 w/m-° C.

Stress relief structure 40 may be formed of a thermally conductive material such as for example, metal, tungsten, aluminum, aluminum alloy, polysilicon, silicide, tantalum, refractory metal, copper, copper alloy, gold, gold alloy, tantalum nitride, titanium, titanium nitride, nickel, compounds thereof, alloys thereof, or combinations thereof. The scope of the present disclosure is not limited to the above-mentioned materials and other materials are also contemplated such as, for example ceramic, solder, or plastic. The materials used for the stress relief structures 40 may be the same throughout the stress relief structures 40 or may vary at different locations in the stress relief structures 40.

According to one or more embodiments, stress relief structures 40 may have good thermal conductivity, which may be greater than about 20 W/m-° C., for example. Alternatively, stress relief structures 40 have a thermal conductivity equal to or greater than the thermal conductivity of silicon. According to some embodiments, stress relief structure 40 includes substantially a same material as either substrate 20 or dies D1, D2, D3, or D4.

Figures 3A, 3B, 3C, 3D, 3E:
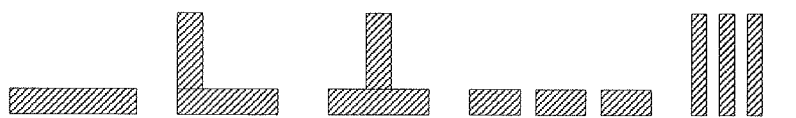
FIG. 3a-3j are top views of various shapes of the stress relief structures, according to various aspects of the present disclosure.
Figures 3F, 3G, 3H, 3I, 3J:
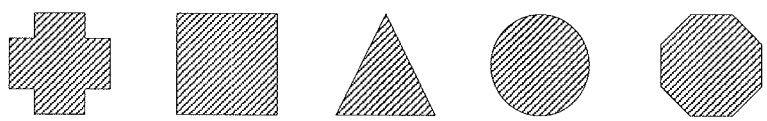

According to one or more embodiments, stress relief structure 40 may have irregular or regular shapes, such as, for example a rectangle (FIG. 3a), an L-shape (FIG. 3b), a T-shape (FIG. 3c), a broken strip (FIG. 3d), a rectangular array (FIG. 3e), a cross (FIG. 3f), a square (FIG. 3g), a triangle (FIG. 3h), a circle (FIG. 3i), and a polygon (FIG. 3j). A combination of the above-mentioned shapes or other shapes based on the spirit of the present disclosure and suitable for reducing the stress caused by the CTE mismatch between the substrate and the die(s) are also contemplated. Stress relief 40 may also have random sizes, random shapes, random thicknesses, and/or random orientations and may be placed randomly in location and orientation. Preferably, stress relief structures 40 will be maximized in accordance with design rules for the layout of the semiconductor package structure.

Still referring to FIG. 1, according to another embodiment of the present invention, stress relief structure 40 is disposed on a periphery of substrate 20, at approximately a mid-section thereof, with at least one of the dies D1, D2, D3, or D4 being adjacent to a stress relief structure 40. According to another embodiment, a stress relief structure 40 is disposed on a periphery of substrate 20, at approximately two or more mid-sections thereof, with at least one of the dies D1, D2, D3, or D4 being adjacent to a stress relief structure 40.

Figure 4:
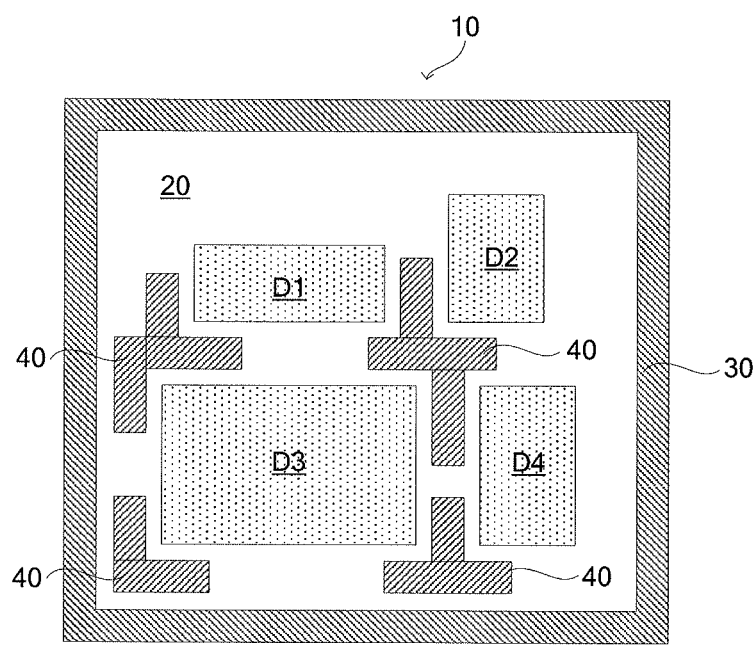
FIG. 4 is a top view of a semiconductor package structure illustrating a layout of stress relief structures on a substrate, according to one embodiment of the present disclosure.

FIG. 4 is a top view of a semiconductor package structure illustrating a layout of stress relief structures on a substrate, according to another embodiment of the present disclosure. Semiconductor package structure 10 includes a plurality of dies D1, D2, D3, and D4 disposed on a substrate 20, with die D3 being the largest die and a plurality of stress relief structures 40 disposed on substrate 20. A stress relief structure 40 is disposed at at least one corner, e.g., a corner of die D3, providing for stress relief at the particular corner of die D3. According to another embodiment, a stress relief structure 40 is disposed at the four corners of die D3, providing for stress relief at the four corners of die D3. As discussed above, a stiffener ring provides for global warpage control of the semiconductor package structure but may not be sufficient to control local warpages in or around the areas of individual dies D1, D2, D3, and D4, especially if the die is a large die compared to the other dies.

Figure 5:
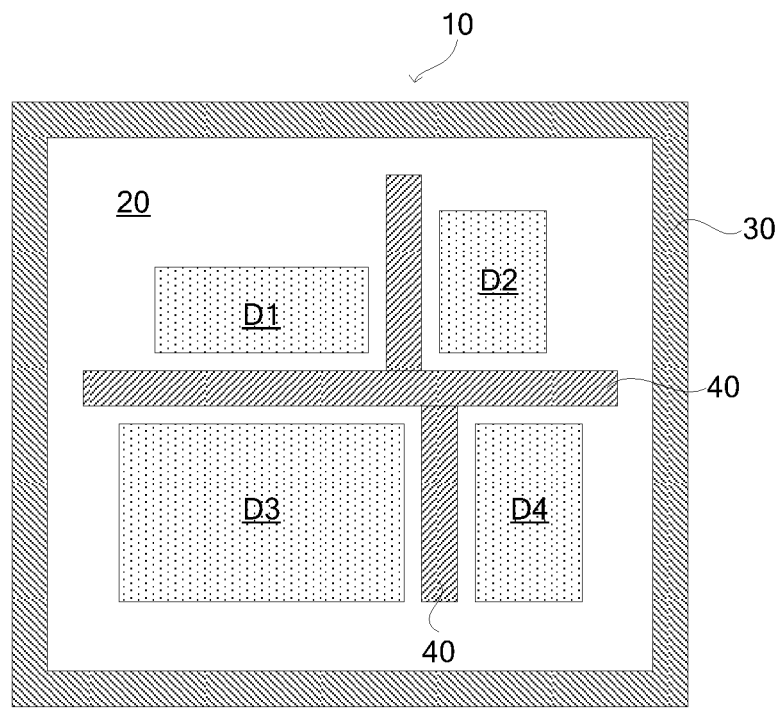
FIG. 5 is a top view of a semiconductor package structure illustrating a layout of stress relief structures on a substrate, according to one embodiment of the present disclosure.
Figure 6:
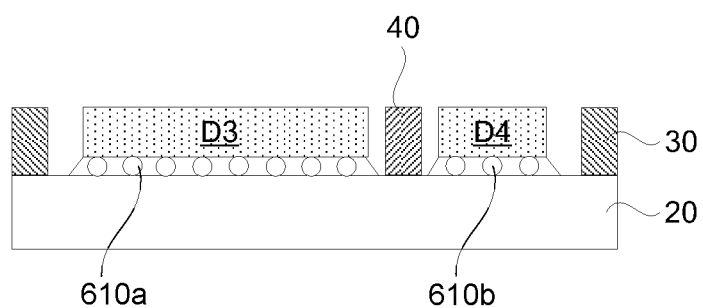
FIG. 6 is a cross-sectional view of the semiconductor package structure of FIG. 5.

FIG. 5 is a top view of a semiconductor package structure illustrating a layout of stress relief structures on a substrate, according to another embodiment of the present disclosure. A stress relief structure 40 is disposed in close proximity to at least one of the dies D1, D2, D3, or D4 with the stress relief structure 40 being a strip extending substantially from close to one edge of the substrate 20 to an opposite edge of the substrate 20. One or more stress relief structure 40 may run between any two or more dies, according to one embodiment. FIG. 6 is a cross-sectional view of the semiconductor package structure 10 of FIG. 5 illustrating a stress relief structure 40 running between dies D3 and D4.

Figure 7:
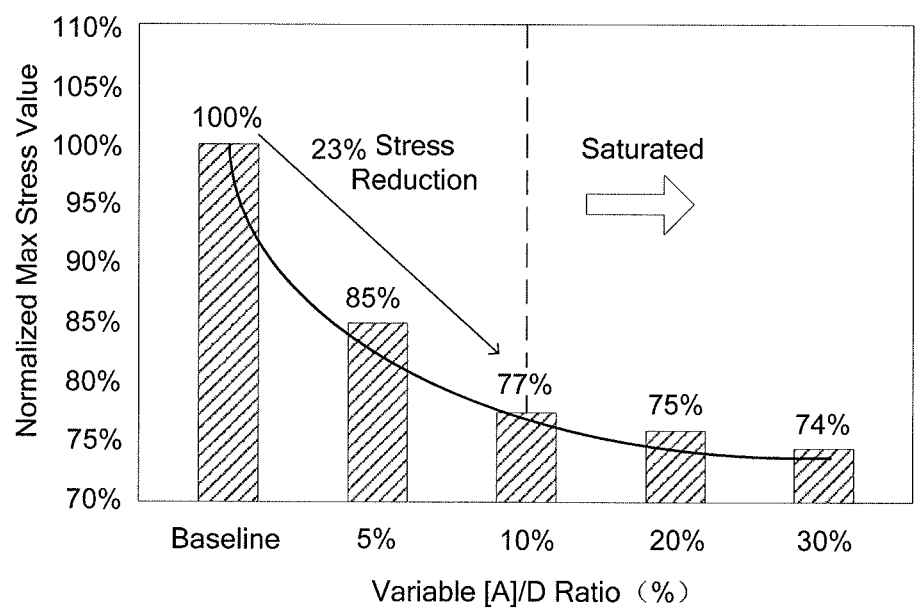
FIG. 7 is a graph showing a curve representing stress reduction when various dimensions of stress relief structures are implemented in a semiconductor package, according to an aspect of the present invention.

Experiments have been performed to evaluate the effect of the stress relief structures on the stress reduction of the semiconductor package structure. FIG. 7 is a graph showing a curve representing stress reduction when various dimensions of stress relief structures are implemented in a semiconductor package structure, according to an aspect of the present invention. The vertical axis represents a stress value and the horizontal axis represents a variable A/D ration (%). It was observed that the reduction of a maximum stress value of the die is dependent on a stress relief structure width [A]. Furthermore, the stress relief structure width [A] may be designed according to various die with D. As shown in FIG. 7, the higher the ratio of A to die width D results in a higher stress reduction. As indicated by a downward arrow, there is a 23% stress reduction from baseline to 10%. The results indicate that stress relief structures 40 have a significant effect in reducing the stress of the semiconductor package structure and therefore enhancing the reliability of the semiconductor package structure.

According to one or more embodiments, the selecting of the placements of the stress relief structures 40 may be performed automatically using a software algorithm. The selecting of the placements using the software algorithm may be performed in accordance with at least one predetermined design rule taking into account the minimum spacing around a particular die. Further, the selecting of the placements using the software algorithm may be performed by a layout tool during a layout process.

One or more embodiments of the present disclosure may provide numerous advantages, including (but not limited to) reducing the stress caused by the difference in coefficients of thermal expansion (CTE) between the package substrate and one or more dies. Teachings of the present disclosure are particularly applicable to large semiconductor package structures where with the increase in the size of the package substrates and the dies, the stress increases. As a result of the increased stresses, the solder cracking becomes more severe and delamination may occur between different layers of the chips. One or more embodiments of the present disclosure help strengthen the semiconductor package structure and helps reduce the likelihood of cracking and peeling. Moreover, one or more embodiments increase the amount of stress a semiconductor package structure can handle. Further, stiffener rings may provide global stress relief to the semiconductor package structure but may not provide adequate local stress relief. Layout of the stress relief structures in one or more embodiments provide for local stress relief and/or warpage control to the semiconductor package structure. Further still, one or more embodiments of the present disclosure improve the output yield and reliability.

It is understood that the stress relief structures 40 described above in conjunction with FIGS. 2, 4, and 5 are merely exemplary. In some embodiments, additional stress relief structures 40 (not shown) are disposed adjacent to the ones shown in these figures. The additional stress relief structures 40, in one or more embodiments, may have shapes exactly as those shown in the figures or shapes similar to those shown in the figures. Furthermore, the additional stress relief structure or structures 40, in one or more embodiments, is/are aligned or misaligned from those shown in the figures.

The present disclosure has described various exemplary embodiments. According to one embodiment, a semiconductor package structure, comprises a substrate, a die region having one or more dies disposed on the substrate, and at least one stress relief structure disposed at one or more corners of the substrate, the at least one stress relief structure being adjacent to at least one die.

One aspect of this description relates to a method of making a semiconductor package structure. The method includes bonding a plurality of dies to a substrate, wherein a first die of the plurality of dies is larger than a second die of the plurality of dies. The method further includes adhering a first stress relief structure to the substrate at a corner of the substrate, wherein a distance between the first stress relief structure to a closest die of the plurality of dies to the first stress relief structure is a first distance. The method further includes adhering a second stress relief structure to the substrate along a single edge of the substrate, wherein a distance between the second stress relief structure to a closest die of the plurality of dies to the second stress relief structure is the first distance. In some embodiments, the adhering of the first stress relief structure includes adhering the first stress relief structure to the substrate using an epoxy, urethane, polyurethane, or silicone elastomers. In some embodiments, the adhering of the first stress relief structure includes curing an adhesive used to adhere the first stress relief structure to the substrate. In some embodiments, the adhering of the first stress relief structure includes adhering the first stress relief structure to the substrate using an adhesive having a thermal conductivity greater than about 10 W/m° C. In some embodiments, the adhering of the first stress relief structure to the substrate includes adhering the first stress relief structure at a location to establish the first distance greater than about 2 microns (μm). In some embodiments, the adhering of the second stress relief structure to the substrate includes adhering the second stress relief structure comprising a same material as the first stress relief structure. In some embodiments, the adhering of the second stress relief structure to the substrate includes adhering the second stress relief structure comprising a plurality of discontinuous segments. In some embodiments, the adhering of the first stress relief structure includes adhering the first stress relief structure having an L-shape. In some embodiments, the adhering of the first stress relief structure to the substrate includes coating an adhesive material on the substrate.

Another aspect of this description relates to a method of making a semiconductor package structure. The method includes bonding a plurality of dies to a substrate, wherein a first die of the plurality of dies is larger than a second die of the plurality of dies. The method further includes depositing a stress relief material on the substrate. The method further includes patterning the stress relief material to define a first stress relief structure to the substrate at a corner of the substrate and a second stress relief structure along a single edge of the substrate. A distance between the first stress relief structure to a closest die of the plurality of dies to the first stress relief structure is a first distance. A distance between the second stress relief structure to a closest die of the plurality of dies to the second stress relief structure is the first distance. In some embodiments, the patterning of the stress relief material includes a photolithography process. In some embodiments, the patterning of the stress relief material includes an etching process. In some embodiments, the depositing of the stress relief material includes depositing the stress relief material having a thermal conductivity greater than about 20 W/m° C. In some embodiments, the patterning of the stress relief material includes defining the second stress relief structure comprising a plurality of discontinuous segments. In some embodiments, the patterning of the stress relief material includes defining the first stress relief structure comprising an L-shape.

Still another aspect of this description relates to a method of making a semiconductor package structure. The method includes bonding a plurality of dies to a substrate, wherein a first die of the plurality of dies is larger than a second die of the plurality of dies. The method further includes defining a first stress relief structure on the substrate, wherein a distance between the first stress relief structure to a closest die of the plurality of dies to the first stress relief structure is a first distance. The method further includes defining a second stress relief structure on the substrate, wherein a distance between the second stress relief structure to a closest die of the plurality of dies to the second stress relief structure is the first distance. In some embodiments, the defining of the first stress relief structure includes depositing a stress relief material on the substrate; and patterning the stress relief material. In some embodiments, the defining of the first stress relief structure includes adhering the first stress relief structure to the substrate. In some embodiments, the defining of the first stress relief structure includes defining the first stress relief structure adjacent to a corner of at least one die of the plurality of dies, wherein the first stress relief structure comprises a first portion extending along a first side of the at least one die and a second portion extending along a second side of the at least one die, and the first portion is continuous with the second portion. In some embodiments, the defining of the second stress relief structure includes defining the second stress relief structure along a single edge of the substrate.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A method of making a semiconductor package structure comprising:
    bonding a plurality of dies to a substrate, wherein a first die of the plurality of dies is larger than a second die of the plurality of dies;
    adhering a first stress relief structure to the substrate at a corner of the substrate, wherein a distance between the first stress relief structure to a closest die of the plurality of dies to the first stress relief structure is a first distance; and
    adhering a second stress relief structure to the substrate along a single edge of the substrate, wherein a distance between the second stress relief structure to a closest die of the plurality of dies to the second stress relief structure is the first distance.

2. The method of claim 1, wherein the adhering of the first stress relief structure comprises adhering the first stress relief structure to the substrate using an epoxy, urethane, polyurethane, or silicone elastomers.

3. The method of claim 1, wherein the adhering of the first stress relief structure comprises curing an adhesive used to adhere the first stress relief structure to the substrate.

4. The method of claim 1, wherein the adhering of the first stress relief structure comprises adhering the first stress relief structure to the substrate using an adhesive having a thermal conductivity greater than about 10 W/m° C.

5. The method of claim 1, wherein the adhering of the first stress relief structure to the substrate comprises adhering the first stress relief structure at a location to establish the first distance greater than about 2 microns (μm).

6. The method of claim 1, wherein the adhering of the second stress relief structure to the substrate comprises adhering the second stress relief structure comprising a same material as the first stress relief structure.

7. The method of claim 1, wherein the adhering of the second stress relief structure to the substrate comprises adhering the second stress relief structure comprising a plurality of discontinuous segments.

8. The method of claim 1, wherein the adhering of the first stress relief structure comprises adhering the first stress relief structure having an L-shape.

9. The method of claim 1, wherein the adhering of the first stress relief structure to the substrate comprises coating an adhesive material on the substrate.

10. A method of making a semiconductor package structure comprising:
    bonding a plurality of dies to a substrate, wherein a first die of the plurality of dies is larger than a second die of the plurality of dies;
    depositing a stress relief material on the substrate;
    patterning the stress relief material to define a first stress relief structure to the substrate at a corner of the substrate and a second stress relief structure along a single edge of the substrate, wherein a distance between the first stress relief structure to a closest die of the plurality of dies to the first stress relief structure is a first distance, and a distance between the second stress relief structure to a closest die of the plurality of dies to the second stress relief structure is the first distance.

11. The method of claim 10, wherein the patterning of the stress relief material comprises a photolithography process.

12. The method of claim 10, wherein the patterning of the stress relief material comprises an etching process.

13. The method of claim 10, wherein the depositing of the stress relief material comprises depositing the stress relief material having a thermal conductivity greater than about 20 W/m° C.

14. The method of claim 10, wherein the patterning of the stress relief material comprises defining the second stress relief structure comprising a plurality of discontinuous segments.

15. The method of claim 10, wherein the patterning of the stress relief material comprises defining the first stress relief structure comprising an L-shape.

16. A method of making a semiconductor package structure comprising:
    bonding a plurality of dies to a substrate, wherein a first die of the plurality of dies is larger than a second die of the plurality of dies;
    defining a first stress relief structure on the substrate, wherein a distance between the first stress relief structure to a closest die of the plurality of dies to the first stress relief structure is a first distance; and
    defining a second stress relief structure on the substrate, wherein a distance between the second stress relief structure to a closest die of the plurality of dies to the second stress relief structure is the first distance, and the second stress relief structure is discontinuous with respect to the first stress relief structure.

17. The method of claim 16, wherein the defining of the first stress relief structure comprises:
    depositing a stress relief material on the substrate; and
    patterning the stress relief material.

18. The method of claim 16, wherein the defining of the first stress relief structure comprises adhering the first stress relief structure to the substrate.

19. The method of claim 16, wherein the defining of the first stress relief structure comprises:
    defining the first stress relief structure adjacent to a corner of at least one die of the plurality of dies, wherein the first stress relief structure comprises a first portion extending along a first side of the at least one die and a second portion extending along a second side of the at least one die, and the first portion is continuous with the second portion.

20. The method of claim 16, wherein the defining of the second stress relief structure comprises defining the second stress relief structure along a single edge of the substrate.

* * * * *